10/21/35 XR 4,618,796

United States Patent [19]

Riedlinger

[11] Patent Number: 4,618,796

[45] Date of Patent: Oct. 21, 1986

[54] ACOUSTIC DIODE

[75] Inventor: Rainer Riedlinger, Karlsruhe, Fed. Rep. of Germany

[73] Assignee: Richard Wolf GmbH, Knittlingen, Fed. Rep. of Germany

[21] Appl. No.: 783,143

[22] Filed: Oct. 2, 1985

[30] Foreign Application Priority Data

Oct. 12, 1984 [DE] Fed. Rep. of Germany ....... 3437488

[51] Int. Cl.[4] .............................................. H01L 41/08

[52] U.S. Cl. ................................... 310/311; 310/324; 310/328; 310/326; 310/800

[58] Field of Search ............... 310/311, 322, 324, 326, 310/327, 328, 334–337, 800; 179/110 A, 107 FD; 307/400; 181/175, 156, 179–188, 197, 198, 206, 207

[56] References Cited

U.S. PATENT DOCUMENTS

| | | | |
|---|---|---|---|
| 3,894,198 | 7/1975 | Murayama et al. | 310/322 X |
| 3,975,599 | 8/1976 | Johanson | 179/107 FD |
| 4,156,800 | 5/1979 | Sear et al. | 310/322 X |
| 4,186,323 | 1/1980 | Cragg et al. | 310/324 |
| 4,196,792 | 4/1980 | Grieves et al. | 181/156 |
| 4,211,950 | 7/1980 | Roos | 310/327 |
| 4,427,912 | 1/1984 | Bui et al. | 310/322 |
| 4,453,044 | 6/1984 | Murphy | 310/322 X |
| 4,469,920 | 9/1984 | Murphy | 310/324 X |

*Primary Examiner*—Mark O. Budd
*Attorney, Agent, or Firm*—Hill, Van Santen, Steadman & Simpson

[57] ABSTRACT

A sonic transmitter has placed in front of it or in its acoustic beam path, an acoustic diode comprising at least two peripherally secured foils in mutual contact, the foils having opposed surfaces with a degree of adhesion and/or cohesion such that they may be pulled apart beyond a threshold value which may be acted upon—of negative sound pressure thus suppressing negative sound pulses, whereas positive sound pressures may be transmitted at almost unaltered levels in view of the existing mechanical contact of the foils.

12 Claims, 10 Drawing Figures

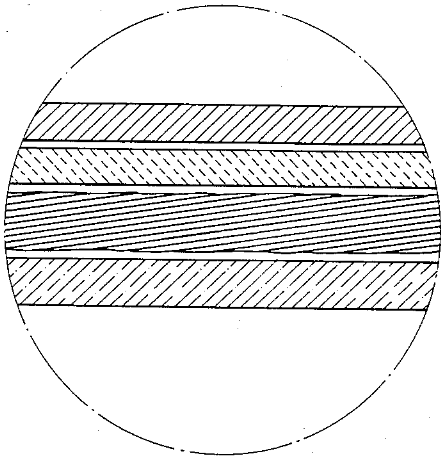
FIG. 1B
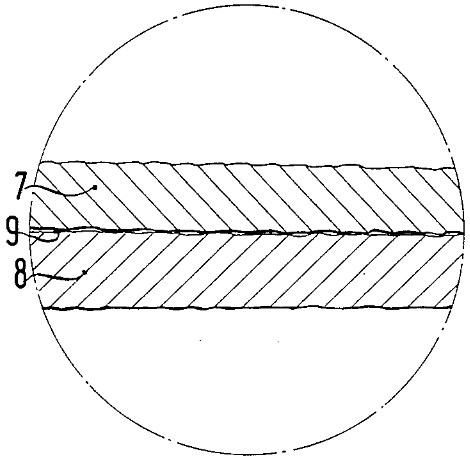
FIG. 1A
FIG. 1
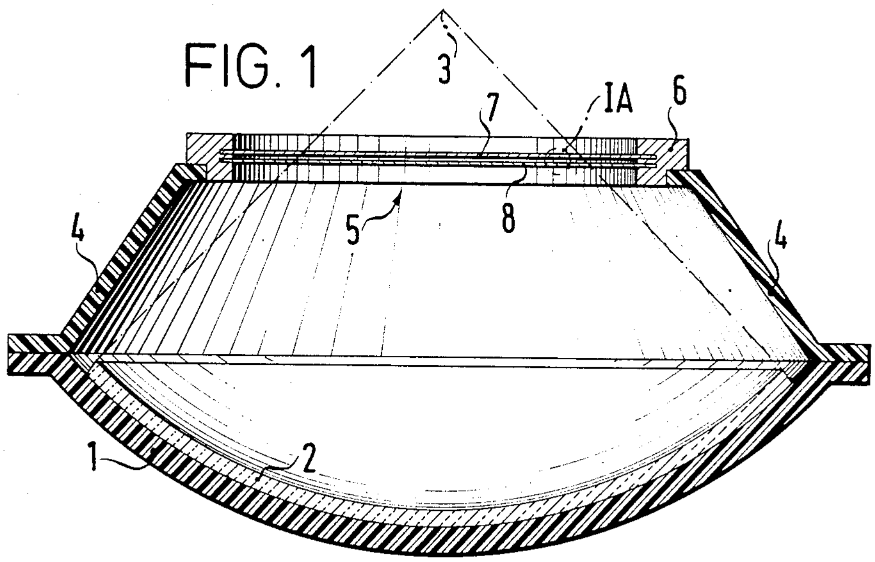
FIG. 2
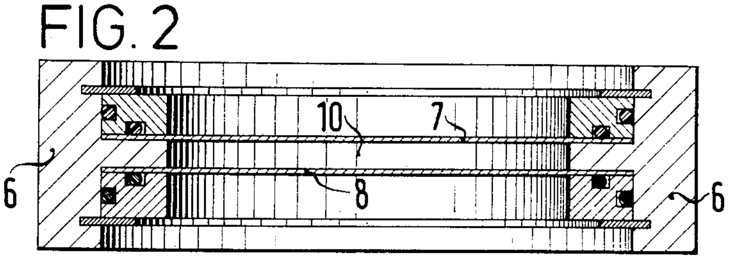

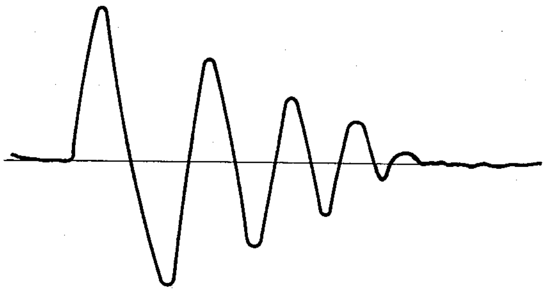
FIG. 3
FIG. 4
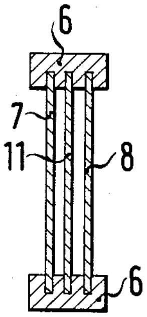
FIG. 5
FIG. 6
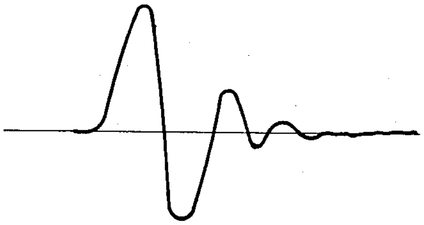
FIG. 7
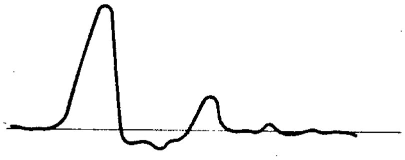
FIG. 8
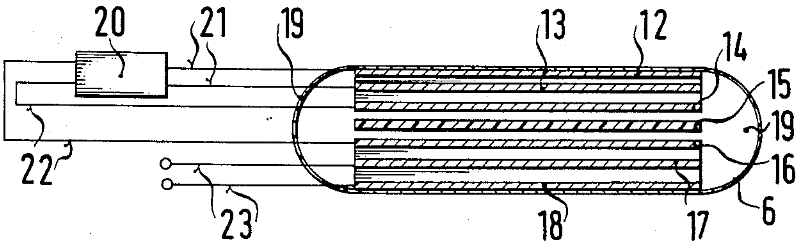

ACOUSTIC DIODE

BACKGROUND OF THE INVENTION

The invention relates to a sonic transmitter comprising a system for suppression of negative sound pulses.

DESCRIPTION OF THE PRIOR ART

As known, sonic transmitters may be constructed in many different ways, e.g. as electric-acoustic transducers (electrodynamic transducers, electromagnetic transducers, electrostatic transducers, piezo-electric transducers, magnetostrictive transducers, etc) or may be based on other sound generation principles such as for example explosion transmitters, hydraulic sound generators, thermic sound generators, etc., in which electrical energy is not converted directly into mechanical energy and whose transducing property is not commonly reversible, i.e. that such sonic transmitter cannot commonly also act as receivers at the same time.

To simplify the description, reference is made in the following to "electro-acoustic transducers" without any intent to cause a limitation of the invention thereby.

In the case of electro-acoustic transducers, it is unavoidable as a rule that each positive pulse half-wave is followed by a negative pulse half-wave, or vice versa. It is now necessary in many cases under application of electroacoustic transducers, to operate only with either the positive or negative wave sections of the acoustic ultrasonic oscillations generated. Different methods are known for suppression of the negative pulse wave, e.g. by a powerful mechanical or electrical damping action on the electroacoustic transducer system itself or by post-control of the transducer action by feedback of the output quantity measured.

SUMMARY OF THE INVENTION

Accordingly, the object of the invention consists in providing an electro-acoustic transducer wherein only positive half-waves are placed in operation and the negative half-waves are suppressed in a particularly uncomplicated manner.

In accordance with the invention, and by contrast to the known measures requiring extremely high expenditure, this object is achieved in that an acoustic diode is placed directly in front of the sonic transmitter or in its acoustic signal path, which comprises at least two peripherally secured foils having opposed surfaces in mutual contact, or in close proximity wherein said opposed surfaces allow the foils to be pulled apart under tensile stress by adhesion and/or cohesion as a controllable threshold value of the negative sound pressure, whereas positive sound pressures may be transmitted at almost unaltered levels because of the existing mechanical contact of the foils.

Thanks to this solution, the negative half-wave of each sound pulse is at least partially suppressed as a result of the temporally and spatially limited pulling-apart of the foils or blocked against transversal by the diode, and the positive half-waves or unipolar pulses may thereby be generated and utilised at comparatively low cost. The solution according to the invention operates in the acoustic sphere in a similar manner to that of an electrical diode, and is consequently referred to herein as an acoustic diode.

The adhesion and/or cohesion between the foils of an acoustic diode may be established in an uncomplicated manner, that is to say in accordance with the purpose of application e.g. by selection of the type of foil material, by the gap between the foils, by endowing the foils with a superficial texture or roughening, by means of solid, pulverulent, liquid or gaseous substances introduced between the foils and in a particularly uncomplicated manner by a vacuum the degree of which may also be adjusted by means of a vacuum pump. Finally, an adhesion effect may also be produced by means of an electrostatic action.

According to the invention, the requisite two or more foils of the acoustic diode and also any intermediate layers which may be provided consist of metal or a plastics material or a combination, at least one foil advantageously being intended to have electrostatic transducer properties if use is made of more than two foils. The electro-acoustic transducer property of this foil or foils allows direct measurement of the sound pressure at the acoustic diode on the one hand (at the side facing towards or away from the sonic transmitter, depending on their position in the foil system as a whole), and on the other hand a foil having an electro-acoustic transducer property allows electrical control of the sound throughput properties complimentarily to the already existing mechanical effect of the acoustic diode).

The foil thicknesses are preferably smaller than the wavelength of the sound wave emitted by the sonic transmitter, so that no appreciable throughput losses occur in case of the foils having a characteristic sound impedance differing from the characteristic sound impedance of the sound-ducting medium.

In application, the acoustic diode may be matched in curvature to the sound wavefront of an acoustic transducer and it is possible for intensification of their action to make use of several acoustic diodes arranged laterally parallel to each other under mutual electrical insulation (if this appears to be necessary as regards circuit technology), the two extremities being closed off by a cover having gas-filled spaces with a low and adjustable negative pressure. The covers form a closed volume with the foils, for evacuation of said volume.

BRIEF DESCRIPTION OF THE DRAWINGS

The invention is described with reference to the drawings, in which are illustrated examples of an acoustic discriminator according to the invention. In the drawings:

FIG. 1 shows a piezo-electric transducer for disintegrating stones within the human body;

FIG. 1*a* shows a part of the diode as a circled part of FIG. 1, under great enlargement;

FIG. 1*b* shows the same enlarged diode part in a modified embodiment;

FIG. 2 shows a cross-section through the acoustic discriminator, enlarged as compared to FIG. 1;

FIG. 3 shows a normal sound pulse of an acoustic transducer;

FIG. 4 shows the sound pulse modified under application of the diode according to FIG. 2;

FIG. 5 shows a modified diagrammatically illustrated diode comprising three foils;

FIGS. 6, 7 show a normal sound pulse and one emitted by means of an acoustic diode and, FIG. 8 shows an acoustic diode structure comprising a regulator system, in the blocked condition.

The acoustic diode is illustrated in its blocking condition, in FIGS. 1, 1*b*, 2, 5 and 8, and in its passing condition in FIG. 1*a*.

DETAILED DESCRIPTION OF THE PREFERRED EMBODIMENTS

The invention is primarily described with reference to an example according to FIG. 1. This example relates to a piezo-electric transducer for disintegration of kidney stones or other stones in bodily cavities in humans. For example in accordance with the embodiment according to German patent specification No. 33 19 871, this transducer comprises a spheroidal bowl 1 as a carrier for a piezoelectric layer 2 of piezoceramic elements. After applcation of a voltage, this transducer emits ultrasonic waves with a focus 3 which is brought into congruence in practice with the stone which is to be shattered. With a lateral delimitation 4, the carrier 1 bearing the piezo-electric layer 2 forms a water-filled housing which is delimited by an acoustic diode 5 according to the invention, which is thus situated in the beam path between the piezo-electric layer 2 and the focal point 3.

For example according to FIG. 1*a*, the acoustic diode 5 comprises two foils 7 and 8 hermetically held at the periphery by a ring 6 whose thickness is advantageously smaller than the wavelength of the sound wave emitted by the transducer and which have a roughened texture 9 on their surfaces establishing a pointwise or areal contact between the two foils 7, 8 between which the gap marked 10 in FIG. 2 may be filled with solid, pulverulent, liquid or gaseous substances, thereby establishing the desired adhesion and/or cohesion between the foils, which below a threshold value of the negative half-waves of the ultrasonic pulses transmitted allows the foils to be pulled apart, and thereby prevents deleterious effects of these negative half-waves (cavitations). It is also possible to place the spaces between the two foils under a vacuum inclusive or exclusive of the aforesaid measures, and in particularly advantageous manner to connect these to a vacuum pump moreover, to allow of adjusting the hardness of the vacuum and thereby the blocking action of the acoustic diode. Among the foils consisting of metal or of plastics material, it is also possible to make a selection as a function of the properties of the particular metal or plastics material. It is possible furthermore, to secure the required adhesion by means of an electrostatic action.

The ultrasonic oscillations which would normally be transmitted without the acoustic diode 5 have the wave shape according to FIG. 3. By interposing the acoustic diode 5 in the beam path of the transducer, the negative half-wave is suppressed according to FIG. 4, i.e. the diode blocks the negative half-wave by the fact that the foils 7, 8 may be pulled apart (being affected by a threshold value as a result of their adhesion or cohesion), so that the transmissible negative sound pressures cannot exceed the value of the ambient pressure (CA1 bar) when the foil gaps are under vacuum, that is to say amount to at most 1 bar if the adhesion forces are assumed to be zero.

As shown in FIG. 5, it is also possible to intensify the action of the acoustic discriminator, e.g. by application of more than two foils, e.g. three foils 7, 8, 11, in which connection it is advantageous if one of the foils, e.g. the middle foil 11, has piezo-electric properties. In the case of the embodiment shown in FIG. 5, the standard ultrasonic oscillation according to FIG. 6 is so modified that it is fundamentally only the positive half-wave according to FIG. 7 which may come into action.

A structure for an acoustic diode formed by layers 12 to 18, and which is provided with an electrical regulator system 20, is shown in FIG. 8. The purpose of this regulator system 20 is to lower the quantity of the limiting value apparent from FIGS. 4 and 7. This is performed in the following manner.

The foils 12, 13 facing towards the sonic transmitter form part of an electrostatic pressure receiver (capacitor receiver with a solid dielectric) and feed a quantity proportional to the pressure to the regulator 20 via the input terminal 21. The latter maintains charges of opposed polarity at the foil terminals 14, 16 via its output terminal 22, for as long as the pressure detected by the foils 12, 13 is positive. If a negative pressure occurs on the foil 12, the regulator is supplied via the input terminals 21 with an input quantity which establishes charges of identical polarity at the foil terminals 14, 17 via its output terminal 22 and thereby acts with an adjustable level against the adhesion forces between 14,15,16 and promotes the mechanical separation of the foils 14, 16 (and 15 if applicable). The foil 15 is an intermediate layer, which is electrically insulating and selected to be appropriate as regards material and surface texture, e.g. a polytetrofluoroethylene sheet foil. The foils 17,18 are parts of another capacitor transducer having a solid dielectric, for measuring the pressure at the opposed side.

I claim:

1. Sonic transmitter comprising a source of sonic waves and a system for suppression of negative sound pulses, wherein there is positioned across the acoustic signal path of said sonic wave source an acoustic discriminator comprising at least two peripherally secured foils normally in contact with each other, said foils having opposed surfaces with a degree of cohesion between them such as to enable them to be pulled apart at a variable threshold value of negative sound pressure, thereby suppressing said negative pulses whereas positive sound pulses can be transmitted at almost unaltered levels in view of the existing mechanical contact of the foils.

2. A sonic transmitter as claimed in claim 1, wherein said cohesion between said foils is obtained by means of a substance interposed in gaps between the foils.

3. A sonic transmitter as claimed in claim 1, wherein said cohesion is obtained by means of a vacuum between said foils.

4. A sonic transmitter as claimed in claim 1, wherein said cohesion is obtained by electrostatic action between said foils.

5. A sonic transmitter as claimed in claim 1, wherein said foils comprising a material selected from metal and plastics material.

6. A sonic transmitter as claimed in claim 1, wherein more than two said foils are provided, at least one having a piezoelectric property.

7. A sonic transmitter as claimed in claim 1, wherein said opposed surfaces of said foils are roughened.

8. A sonic transmitter as claimed in claim 1, wherein the foil thickness is smaller than the wavelength of the sound waves emitted by said source.

9. A sonic transmitter as claimed in claim 3, wherein the static pressure between the foils is adjustable by means of a connectible vacuum pump.

10. A sonic transmitter as claimed in claim 1, wherein the foils of the acoustic diode have a curvature adapted to the sound wavefront emitted by said source.

11. A sonic transmitter as claimed in claim 1, wherein several acoustic diodes are placed laterally parallel to each other under mutual separation and are covered at the extremities by an envelope having gas-filled spaces with an easily adjustable negative pressure.

12. A sonic transmitter as claimed in claim 1, wherein said sonic wave source is a piezo-electric transducer which comprises a piezo-electric layer of cylindrical piezo-ceramic elements which are situated in a carrier in the form of spheroidal bowl which concentrates the ultrasonic oscillation on a focus, and wherein said acoustic discriminator is positioned across the acoustic signal path between said transducer and said focus.

* * * * *